(12) United States Patent
Edelhaeuser et al.

(10) Patent No.: US 9,710,191 B1
(45) Date of Patent: Jul. 18, 2017

(54) RAPID MEMORY BUFFER WRITE STORAGE SYSTEM AND METHOD

(71) Applicant: MONTEREY RESEARCH, LLC, Santa Clara, CA (US)

(72) Inventors: Frank Edelhaeuser, Dresden (DE); Clifford A. Zitlaw, Sunnyvale, CA (US); Jeremy Mah, San Jose, CA (US)

(73) Assignee: MONTEREY RESEARCH, LLC, Santa Clara, CA (US)

( * ) Notice: Subject to any disclaimer, the term of this patent is extended or adjusted under 35 U.S.C. 154(b) by 0 days.

(21) Appl. No.: 15/098,156

(22) Filed: Apr. 13, 2016

Related U.S. Application Data

(63) Continuation of application No. 13/764,602, filed on Feb. 11, 2013, now Pat. No. 9,317,445, which is a continuation of application No. 12/337,963, filed on Dec. 18, 2008, now Pat. No. 8,386,736.

(51) Int. Cl.
*G06F 3/06* (2006.01)
*G06F 11/10* (2006.01)
*G11C 29/52* (2006.01)
*G06F 12/1036* (2016.01)
*G06F 12/10* (2016.01)

(52) U.S. Cl.
CPC ............ *G06F 3/0656* (2013.01); *G06F 3/061* (2013.01); *G06F 3/0613* (2013.01); *G06F 3/0673* (2013.01); *G06F 11/1068* (2013.01); *G06F 12/1036* (2013.01); *G11C 29/52* (2013.01); *G06F 12/10* (2013.01); *G06F 2212/1041* (2013.01); *G06F 2212/657* (2013.01)

(58) Field of Classification Search
CPC ...... G06F 3/061; G06F 3/0656; G06F 3/0613; G06F 11/1068; G06F 12/10
USPC .......................................... 711/167, 118, 202
See application file for complete search history.

(56) References Cited

U.S. PATENT DOCUMENTS

| | | | | |
|---|---|---|---|---|
| 5,937,435 A | * | 8/1999 | Dobbek | G11B 20/1883 711/202 |
| 6,901,500 B1 | | 5/2005 | Hussain et al. | |
| 7,664,905 B2 | | 2/2010 | Jarosh et al. | |
| 8,386,736 B2 | | 2/2013 | Edelhaeuser et al. | |
| 8,756,401 B2 | * | 6/2014 | Tanaka | G06F 3/0613 711/115 |
| 2007/0073961 A1 | | 3/2007 | Yabushita | |
| 2007/0180186 A1 | * | 8/2007 | Cornwell | G06F 12/023 711/103 |

(Continued)

OTHER PUBLICATIONS

USPTO Advisory Action for U.S. Appl. No. 13/764,602 dated Jun. 30, 2014; 4 pages.

(Continued)

*Primary Examiner* — Than Nguyen
(74) *Attorney, Agent, or Firm* — Kunzler Law Group, PC (57) ABSTRACT

Data associated with a logical block address (LBA) may be received from a host system to be stored in the memory array. The LBA may be translated to a physical block address (PBA) by determining a first portion of the PBA and a second portion of the PBA. The data from the host system may be stored in the buffer space after determining the first portion of the PBA and before determining the second portion of the PBA. The data from the buffer space may be flushed to the memory array after determining the second portion of the PBA.

5 Claims, 11 Drawing Sheets (56) References Cited

U.S. PATENT DOCUMENTS

| | | | |
|---|---|---|---|
| 2007/0208913 A1* | 9/2007 | Oshima | G06F 13/28 711/154 |
| 2008/0082757 A1* | 4/2008 | Ahmad | G06F 12/0808 711/141 |
| 2009/0031080 A1 | 1/2009 | Kim et al. | |
| 2009/0172345 A1* | 7/2009 | Allen | G06F 12/0246 711/208 |
| 2010/0106893 A1 | 4/2010 | Fasoli et al. | |
| 2010/0174857 A1 | 7/2010 | Horishima et al. | |

OTHER PUBLICATIONS

USPTO Final Rejection for U.S. Appl. No. 12/337,963 dated Oct. 31, 2011; 11 pages.

USPTO Final Rejection for U.S. Appl. No. 13/764,602 dated Apr. 25, 2014; 9 pages.

USPTO Final Rejection for U.S. Appl. No. 13/764,602 dated Oct. 10, 2014; 6 pages.

USPTO Non-Final Rejection for U.S. Appl. No. 12/337,963 dated May 24, 2011; 10 pages.

USPTO Non-Final Rejection for U.S. Appl. No. 12/337,963 dated May 30, 2012; 11 pages.

USPTO Non-Final Rejection for U.S. Appl. No. 13/764,602 dated Sep. 9, 2015; 7 pages.

USPTO Non-Final Rejection for U.S. Appl. No. 13/764,602 dated Dec. 13, 2013; 12 pages.

USPTO Notice of Allowance for U.S. Appl. No. 12/337,963 dated Oct. 31, 2012; 7 pages.

USPTO Notice of Allowance for U.S. Appl. No. 13/764,602 dated May 22, 2015; 7 pages.

USPTO Notice of Allowance for U.S. Appl. No. 13/764,602 dated Dec. 11, 2015; 7 pages.

* cited by examiner

Issuing a first program command.

520

Loading data into the page buffer of the memory starting at column 0.

530

Loading the target row address (PBA) in the memory.

540

Issuing a second program command is issued to the memory.

RAPID MEMORY BUFFER WRITE STORAGE SYSTEM AND METHOD

RELATED APPLICATIONS

This application is a continuation of U.S. patent application Ser. No. 13/764,602, filed Feb. 11, 2013, which is a continuation of U.S. patent application Ser. No. 12/337,963, filed Dec. 18, 2008, now U.S. Pat. No. 8,386,736, issued Feb. 26, 2013, all of which are incorporated by reference herein in their entirety.

TECHNICAL FIELD

This invention relates generally to a information storage systems and methods and more particularly, to systems and methods for altering information stored in a memory.

BACKGROUND OF THE INVENTION

Electronic systems and circuits have made a significant contribution towards the advancement of modern society and are utilized in a number of applications to achieve advantageous results. Electronic technologies such as digital computers, calculators, audio devices, video equipment, and telephone systems have facilitated increased productivity and reduced costs in analyzing and communicating data, ideas and trends in most areas of business, science, education and entertainment. Frequently, the electronic systems designed to provide these results include memories. However, accessing memory resources in a fast and efficient manner can involve complicated protocols.

Figure 1A:
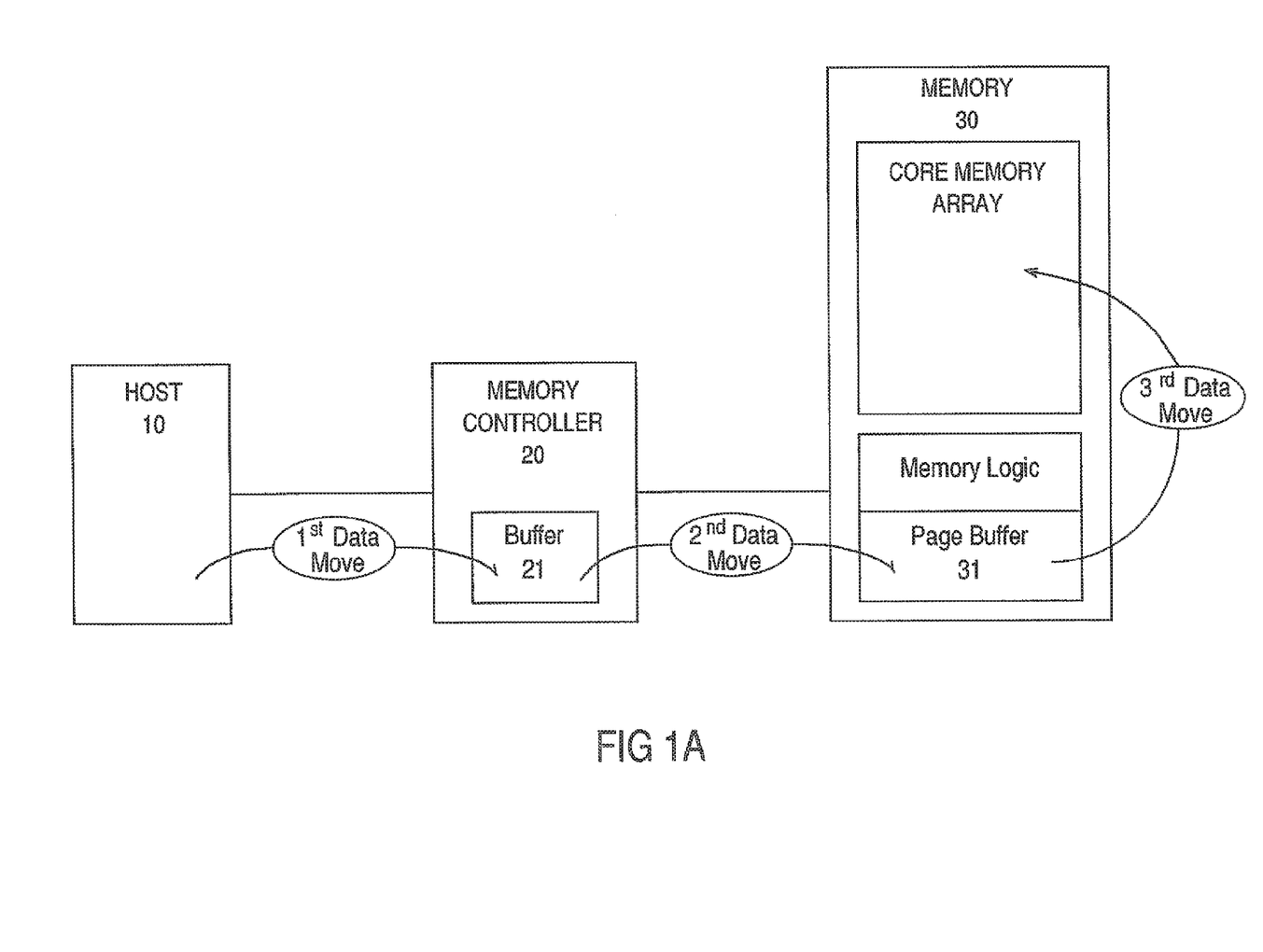
FIG. 1A is a block diagram of a conventional data flow in traditional system.
Figure 1B:
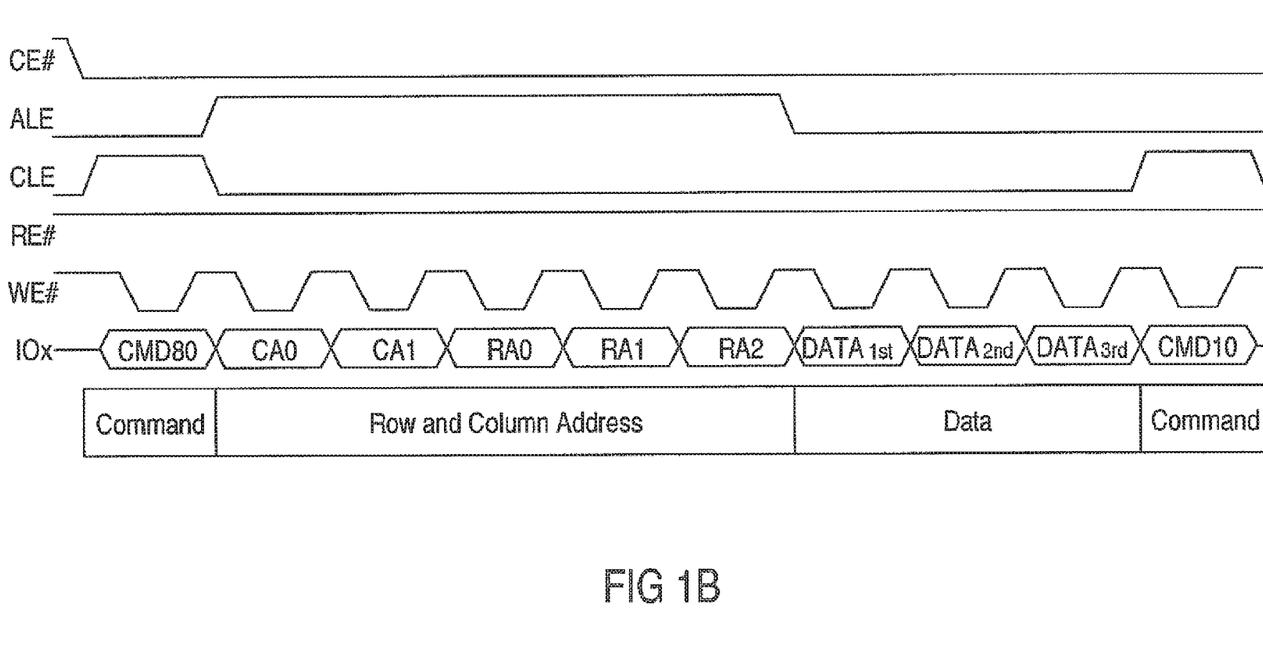
FIG. 1B is a block diagram of a conventional random data input command cycle sequence.
Figure 1C:
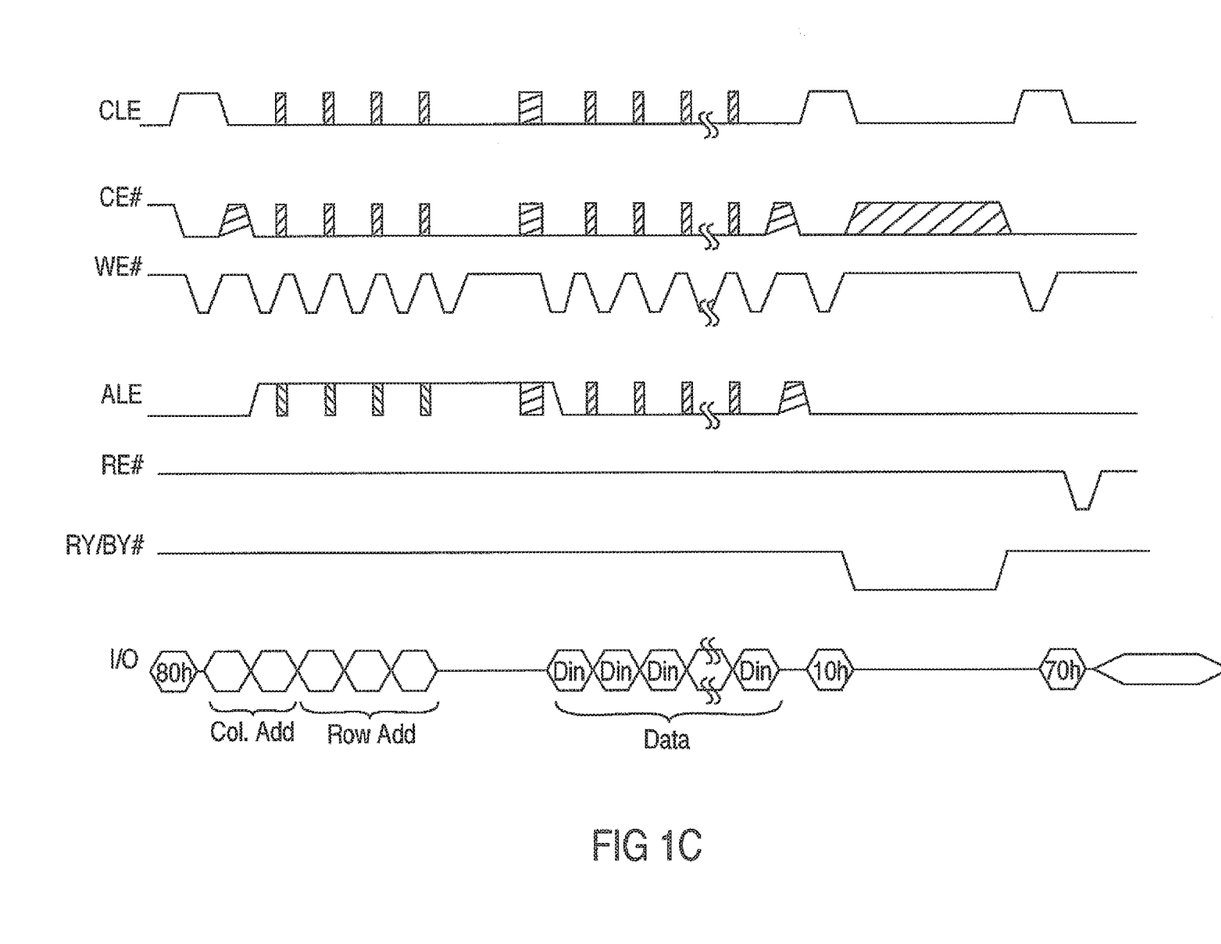
FIG. 1C is a block diagrams of conventional data input command cycle sequences in which address information for a plurality of rows is determined before the data is transferred to the buffer.

Numerous electronic devices include processors that operate by executing software comprising a series of instructions for manipulating data in the performance of useful tasks. The instructions and associated data are typically stored in a memory. Memories usually consist of a location for storing information and a unique indicator or address. The utility a device provides often depends upon the speed and efficiency at which instructions are executed. The ability to access a memory and transfer information quickly and conveniently usually has a significant impact on information processing latency. In traditional systems such as shown in FIG. 1A, information is typically transferred from a host 10 to a buffer 21 in a memory controller 20 while complete address information is determined and then the data and physical address information is transferred to a buffer 31 of memory 30. FIGS. 1B and 1C are block diagrams of conventional data input command cycle sequences in which column and row address information is determined before the data is transferred to the buffer 31 in memory 30.

Traditional attempts at memory control are often very convoluted and complex. Such protocols also suffer from inefficiency and overhead in regards to latency and available bandwidth throughout the system, which can result in issues with scheduling due to unknown traffic patterns and limited resources. Such latency problems can be experienced by a host attempting to read or write information to the memory. There are a number of applications (e.g., real time applications) where processing time is critical and extended latency in retrieving or writing information to a memory can have detrimental impacts on performance and user experience. For example, in real time applications extended latency can cause jumpy presentations.

Information is typically written by a program operation that programs or writes a particular memory cell or group of cells (e.g., page, block, etc.). The particular memory cell is typically assigned an identification or address and the system utilizes the address in tracking which cell is storing a particular piece of information. Conventional memory cells are typically configured in a memory array arranged in columns and rows. Traditional approaches can exacerbate latency delays when determining the appropriated column and row indication for an address.

SUMMARY OF THE INVENTION

Efficient and convenient storage systems and methods are presented. In one embodiment a storage system includes a host for processing information, a memory controller and a memory. The memory controller controls communication of the information between the host and the memory, wherein the memory controller routes data rapidly to a buffer of the memory without buffering in the memory controller. The memory stores the information. The memory includes a buffer for temporarily storing the data while corresponding address information is determined.

BRIEF DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Some portions of the detailed descriptions which follow are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

Figure 2:
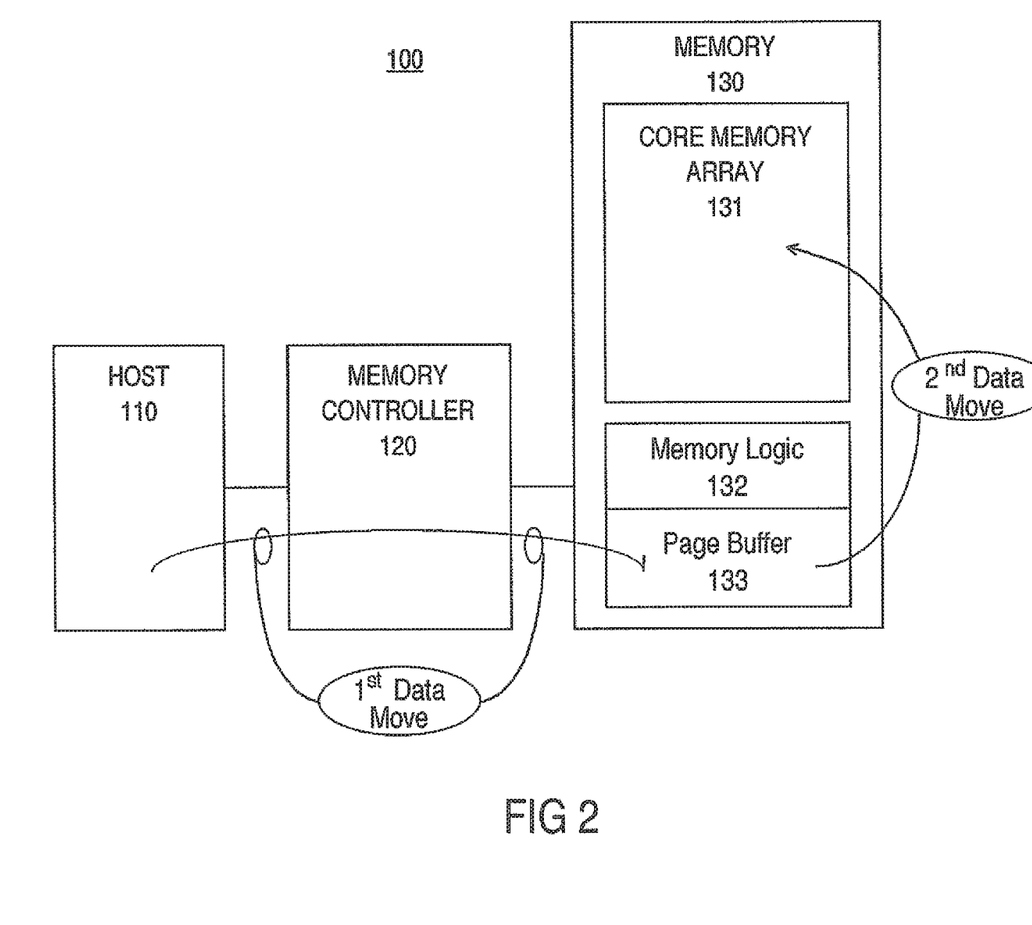
FIG. 2 is a block diagram of an exemplary memory system in accordance with one embodiment of the present invention.

FIG. 2 is a block diagram of a memory system 100 in accordance with one embodiment of the present invention. Memory system 100 includes host 110, memory controller 120, and memory 130. Host 110 is coupled to memory controller 120, which is coupled to memory 130. In one embodiment, memory 130 includes core memory array 131, memory logic 132 and page buffer 133.

The components of memory system 100 cooperatively operate to store information. Host 110 processes information. Memory controller 120 controls communication of the information between host 110 and memory 130. Memory 130 stores the information for host 110. In one exemplary implementation, core memory array 131 is an array of memory cells for storing bits arranged in rows and columns. The rows can be associated with addresses configured to store a "word" of bits at a particular address. Memory logic 132 coordinates the operations within memory 130. In one embodiment the memory 130 is a NAND device.

In one embodiment, storing information in memory system 100 involves writing and erasing information in core memory array 131. It is appreciated the present invention is readily adaptable to a variety of writing and erasing operations. The page buffer 133 temporarily stores data to be forwarded to the core memory array 131. For example, memory system 100 can perform rapid memory buffer write operations.

In one embodiment, the memory system 100 performs a rapid memory buffer write operation with a reordered command cycle sequence. The memory alteration includes one or more command cycles in which various write operations are performed. In one embodiment, the write operations in a command cycle can include a command indication, data and some of the address information. For example, during a write operation the host system sends the memory controller an indication to write data and also sends an indication of a logical address associated with the data. In one embodiment, during a rapid memory buffer write the memory controller rapidly forwards the data to a buffer of a memory device (e.g., page buffer 133 of memory device 130, etc.) and is not stored in a buffer of a memory controller (e.g., memory controller 120) while complete corresponding address information is determined. The memory controller can rapidly forward just the data or can also rapidly forward some address information (e.g., column address information, etc.). The buffer (e.g., page buffer 133, etc.) of the memory device temporarily stores the data until the remainder of the address information (e.g., row address, etc.) is determined by the memory controller (e.g., memory controller 120, etc.). In one exemplary implementation, the information can also be temporarily stored in the page buffer for one or more random data input command cycles.

It is appreciated that the present invention facilitates efficient write operations. In many of the embodiments and exemplary implementations described herein, the terms, "rapid", "rapidly", "direct", "directly", "quickly", "immediately", etc. are utilized to convey the communication of data to a memory device without being stored in a buffer of a memory controller while complete corresponding physical address information is determined. It is appreciated that utilization of the terms direct or directly to indicate information (e.g., data, a portion of address information, etc.) is communicated to a memory device also encompasses implementations in which the information flows through other components (e.g., memory controller, etc.). In one embodiment, the data received from the host can be "directly" forwarded to a buffer of the memory (e.g., memory device's data buffer, memory device's page buffer, etc.) "via" other components (e.g., a memory controller, etc.) and stored in the buffer of the memory while the remaining portion of the corresponding address information is determined.

FIG. 2 also illustrates one exemplary flow of data in memory system 100 in accordance with one embodiment of the present invention. In one embodiment, at least a portion of the address information (e.g., row information, etc.) is determined after the data is stored in the buffer of the memory device, unlike a conventional approach in which the memory controller completely translates the logical block address (LBA) from the host system into a physical block address (PBA) of the memory device prior to initiating a program sequence to the memory device. In one exemplary implementation, the present rapid memory buffer write operation utilizes the page buffer in the memory device as a temporary storage until the row address value of the physical block address (PBA) is determined. Thus, the conventional buffer in the memory controller is not required for storing data while the row address value of the physical block address (PBA) is determined.

In one embodiment, when determining the physical block address (PBA), the memory controller determines both the target row and column addresses in the memory device. The determination is split into two phases since determining target row address information takes more time than the target column address information. Splitting the determination into two phases facilitates communication of a portion of the address information and data rapidly to the buffer of a memory device before the remaining portion of the address information is determined.

It is appreciated the present invention is readily adaptable to efficiently utilize characteristics of a memory column and row configuration. In one exemplary implementation, each 2 KB row in a memory device contains four physical block address (PBA) regions (4×512B+spare). The starting column address for the four PBA regions can be specified by the two least significant bits of the logical block address (LBA) from the host. In this exemplary implementation, the column address can be calculated directly and forwarded to the memory device while the target row address requires a much more significant amount of calculation time. The column address information can also be directly forwarded if the load buffer command default to column address zero in the page buffer. It is appreciated that the present invention is readily adaptable to a variety of sequence orders that are different from conventional approaches.

Figure 3:
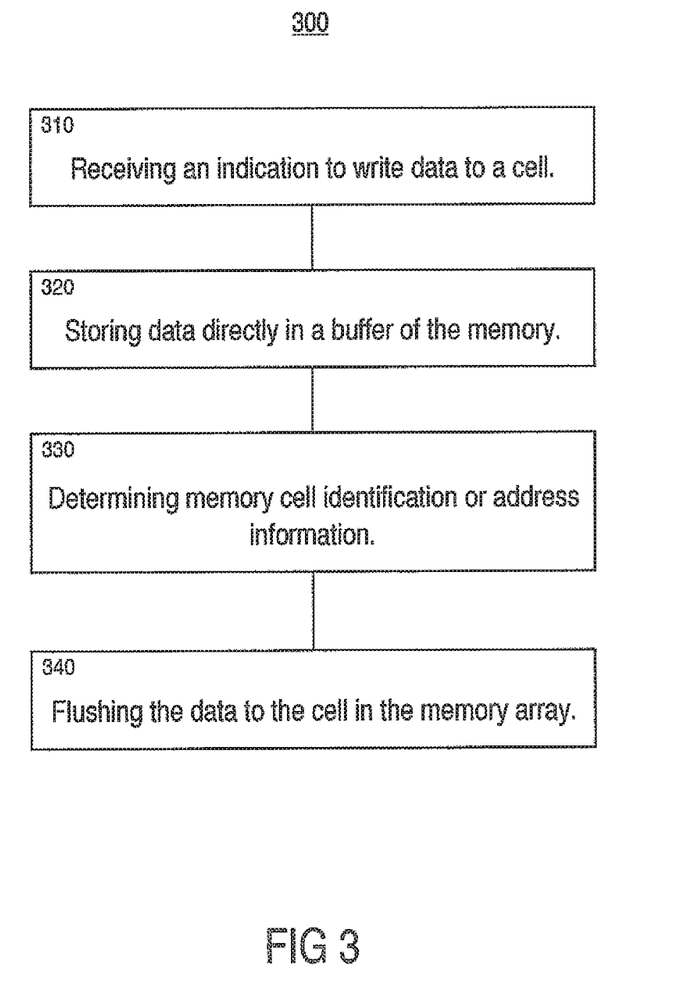
FIG. 3 is a flow chart of an exemplary memory alteration process utilizing a rapid memory buffer write in accordance with one embodiment of the present invention.

FIG. 3 is a flow chart of exemplary memory alteration process 300 in accordance with one embodiment of the present invention. In one embodiment, memory alteration process 300 loads data in a memory device buffer before some portion of the address information is forwarded to the memory device.

In step 310, an indication is received to write data to a cell. It is appreciated that the indication can also be to write data to a group of cells. In one exemplary implementation the indication to write data to a cell is received in a host.

In step 320, data is stored rapidly in a buffer of the memory. In one embodiment, the buffer is a page buffer in the memory. In one exemplary implementation, the buffer in the memory stores the data while a portion of a physical block address associated with the data is determined by a memory controller. For example, the controller determines the target row address associated with the data while the data is stored in the buffer of the memory.

In step 330, memory cell identification or address information is determined. In one exemplary implementation, resolution of the different portions of memory cell address information takes different amounts of time. For example, determination of column address information is relatively rapid while determination or row address information takes significantly longer. In one embodiment, a portion of the memory cell address information is determined after the data is stored rapidly in the buffer of the memory.

In one exemplary implementation, a column address is determined before the data is stored rapidly in a buffer of the memory. For example, a starting column address for a region including a plurality of physical block addresses can be specified by the two least significant bits of the logical block address from a host, permitting the column address to be calculated rapidly. The starting column address can also be a default address. In one embodiment, a memory controller determines a row address of a physical block address associated with the data while the data is stored in the buffer of the memory.

In step 340, the data is written or flushed to the cell in the memory array. In one embodiment, the cell is unaltered if the logical state of the data corresponds to the static state and is programmed to a state opposite of the static state if the data corresponds to an opposite logical value. For example, if the static state is a logical 1 and the data corresponds to a logical 1 the cell is left alone but if the data is a logical 0 the cell is programmed or altered to correspond to a logical 0 value.

Figure 4A:
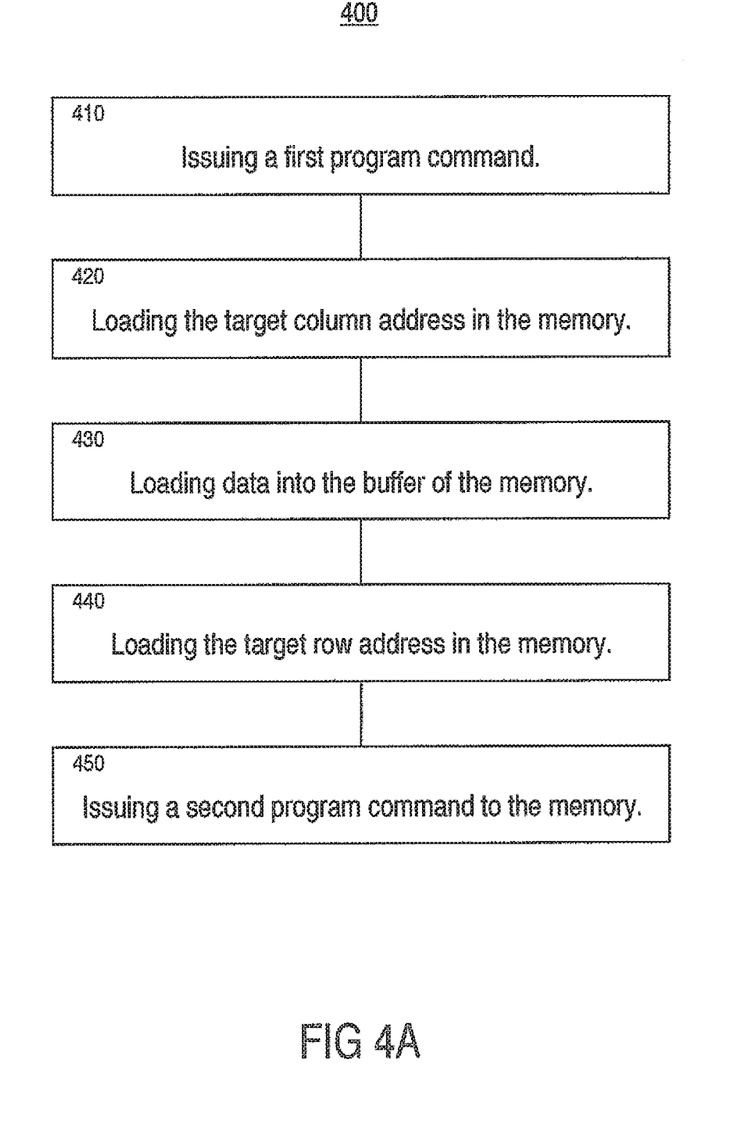
FIG. 4A is a block diagram of an exemplary rapid buffer program sequence method in accordance with one embodiment of the present invention.
Figure 4B:
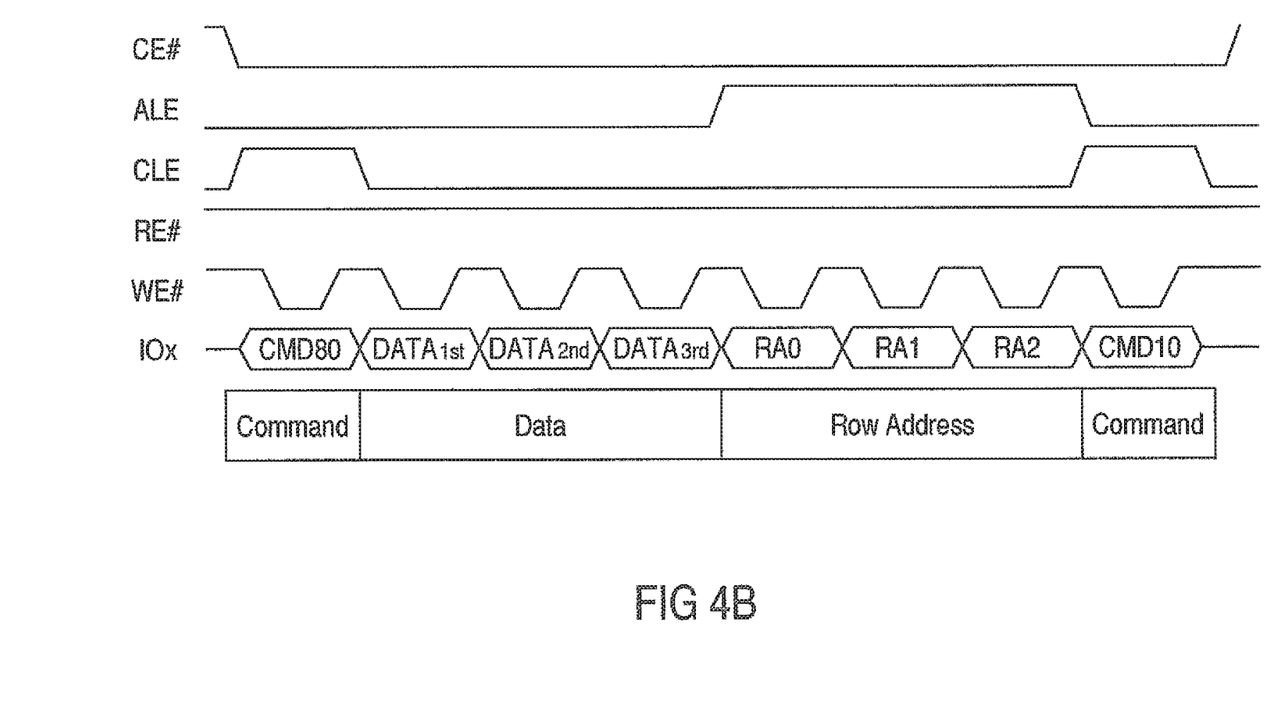
FIG. 4B is a timing diagram in accordance with one embodiment of the present invention corresponding to the rapid buffer program sequence method.

FIG. 4a is a block diagram of exemplary rapid buffer program sequence method 400 in accordance with one embodiment of the present invention. In one embodiment, rapid buffer program sequence method 400 has a sequence order that is different from conventional approaches. In one exemplary implementation of rapid buffer program sequence method 400 the column address is specified prior to the data transfer and the row address is issued after the data transfer. In one exemplary implementation, the starting column address that is specified is not aligned with the beginning of the row. FIG. 4B is a timing diagram in accordance with one embodiment of the present invention corresponding to rapid buffer program sequence method 400.

In step 410, a first program command is issued. In one embodiment, the first program command is a page program command or a cache program command. The first program command can be a load buffer command. In one embodiment, a command latch enable (OLE) signal is asserted and the first program command is forwarded as an input/output (I/O) signal. In one exemplary implementation the first program command is (80h).

In step 420, the target column address is loaded in the memory. In one embodiment, the target column address includes column bits from the physical block address (PBA). In one exemplary implementation, the starting column address for a physical block address is specified by the two least significant bits of the logical block address (LBA) from a host. In one exemplary implementation a command latch enable (OLE) signal is unasserted, an address latch enable (ALE) signal is asserted and column address information is forwarded as an input/output (I/O) signal.

In step 430, data is loaded into the page buffer. In one embodiment, the command latch enable (OLE) is unasserted, a write enable (WE) signal is asserted and data is forwarded as an input/output (I/O) signal. In one exemplary implementation, multiple pieces of data are forwarded.

In step 440, the target row address is loaded in the memory. In one embodiment, the target row address includes row bits from the physical block address (PBA). In one exemplary implementation, the write enable (WE) signal is unasserted, an address latch enable (ALE) signal is asserted and target row information is forwarded as an input/output (I/O) signal. It is appreciated that information associated with multiple rows can be forwarded (e.g., information associated with multiple rows corresponding to the multiple pieces of data loaded in block 420).

In step 450, a second program command is issued to the memory. The second page program command can be a page program confirm command. In one embodiment, the second page program command initiates flushing of the data from the buffer of a memory into the memory array elements (e.g., memory cells, etc.). In one exemplary implementation, the page program command is (10h). In one embodiment, an address latch enable (ALE) signal is unasserted, the command latch enable (CLE) signal is asserted and a page program command is forwarded as an input/output (I/O) signal.

Figure 5A:
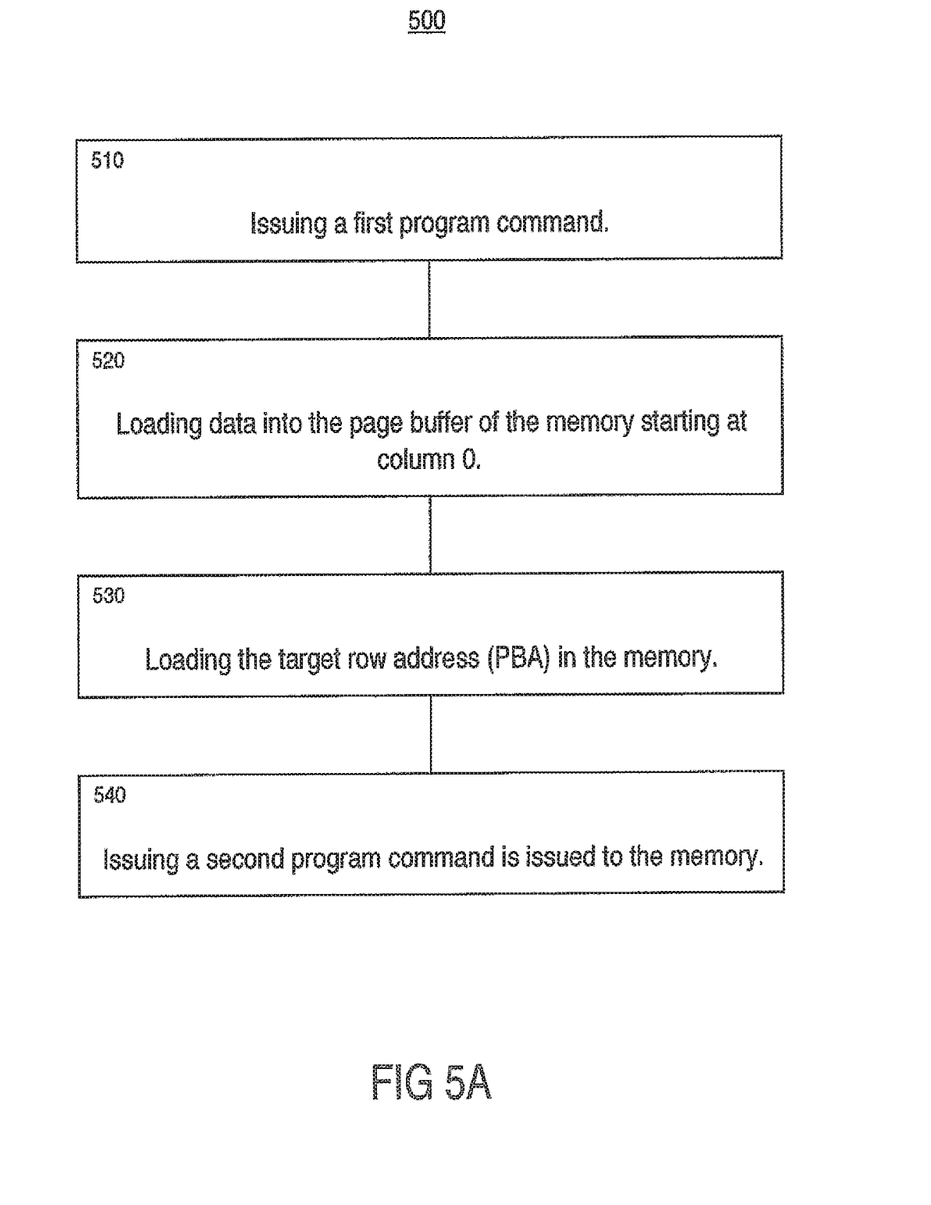
FIG. 5A is a block diagram of an exemplary rapid buffer program sequence method utilizing a default column address in accordance with one embodiment of the present invention.
Figure 5B:
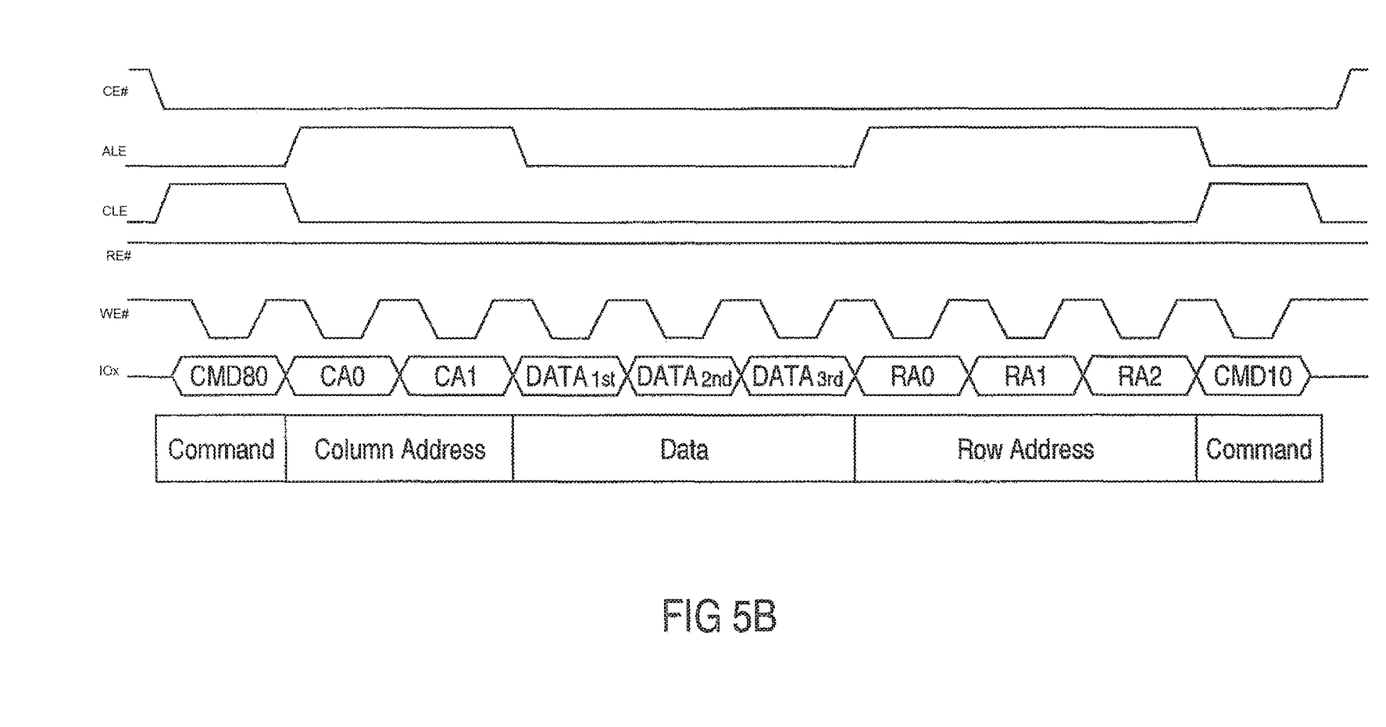
FIG. 5B is an exemplary timing diagram in accordance with one embodiment of the present invention corresponding to the rapid buffer program sequence method utilizing a default column address.

FIG. 5A is a block diagram of exemplary rapid buffer program sequence method 500 in accordance with one embodiment of the present invention. Rapid buffer program sequence method 500 is similar to rapid buffer program sequence method 400 except a default column address is utilized. FIG. 5B is an exemplary timing diagram in accordance with one embodiment of the present invention. In another exemplary implementation, the column address is specified prior to the data transfer and the row address to be issued after the data transfer, the starting column address is specified that is not aligned with the beginning column address of the target row. For example, a first program command (e.g., a load buffer command, etc.) is issued to default to column zero, the data is loaded in to the page buffer starting at column zero, the target row address is loaded, and a page program confirm command is issued.

In step 510, a first program command is issued. In one embodiment, the first program command is a page program command or a cache program command. The first program command can be a load buffer command. In one embodiment, a command latch enable (CLE) signal is asserted and the first program command is forwarded as an input/output (I/O) signal. In one exemplary implementation the first program command is (80h).

In step 520, data is loaded into the page buffer of the memory starting at column 0. In one embodiment, the command latch enable (OLE) is unasserted, a write enable (WE) signal is asserted and data is forwarded as an input/output (I/O) signal. In one exemplary implementation, multiple pieces of data are forwarded.

In step 530, the target row address (PBA) is loaded in the memory. In one exemplary implementation, any additional column information is irrelevant or not loaded. In one embodiment, the target row address includes row bits from the physical block address (PBA). In one exemplary implementation, the write enable (WE) signal is unasserted, an address latch enable (ALE) signal is asserted and target row information is forwarded as an input/output (I/O) signal. It is appreciated that information associated with multiple rows can be forwarded, (e.g., information associated with multiple rows corresponding the multiple pieces of data loaded in block 420).

In step 540, a second program command is issued to the memory. The second program command can be a page program confirm command. In one embodiment, the second page program command initiates flushing of the data from the buffer of a memory into the memory array elements (e.g., memory cells, etc.). In one exemplary implementation, the page program command is (10h). In one embodiment, an address latch enable (ALE) signal is unasserted, the command latch enable (CLE) signal is asserted and a page program command is forwarded as an input/output (I/O) signal.

In one embodiment, the page program command is broken into two phases. The first phase is a data input phase and the second phase includes the actual program operation. In one embodiment a flash internal state machine is readily adaptable to enable a variety of page program sequences. In one exemplary implementation, data is loaded in bursts into a page buffer of the memory and loading the target row address corresponding to the data is at the discretion of firmware. In one embodiment, a memory internal state machine (e.g., utilizing memory logic 132, etc.) can enable program sequences.

Figure 6:
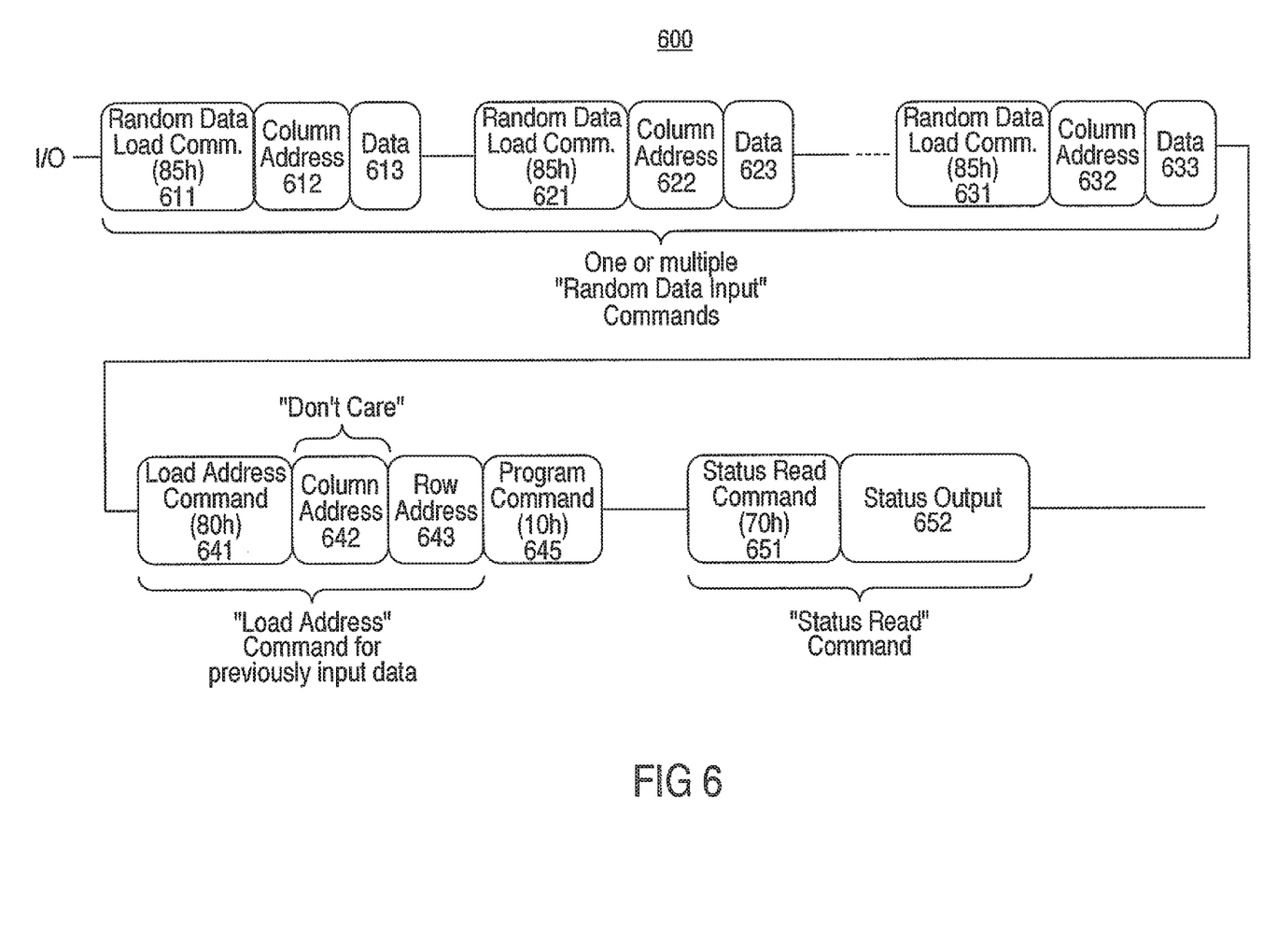
FIG. 6 is a block diagram of an exemplary random data input command cycle sequence in accordance with one embodiment of the present invention.

FIG. 6 is a block diagram of random data input command cycle sequence 600 in accordance with one embodiment of the present invention. In one embodiment, one or more random data input command cycles are forwarded before a load command cycle with row address information. For example, a plurality of command cycles are executed including random data load command (85h) 611, column address 612, data 613, random data load command (85h) 621, column address 622, data 623, random data load command (85h) 631, column address 632, data 623 all of which are forwarded to the memory device before row addresses included with a first program command (80h) 641 (e.g., a load program command, etc), column address 642, row address 643, and program confirm command 645. In one exemplary implementation, the memory does not care about column address 642 and utilizes column address information 612, 622 and 623 or utilizes a default column address. In one embodiment a status read command 651 is issued and a status output 652 is forwarded.

In one embodiment, the column address is not required because there is no data entry taking place after command 80h. In one exemplary implementation the column address is declared "don't care". Alternatively there is an additional data input phase (not shown) after the row or page address. A new command code can also be defined which acts like 80h but skips the column address phase. In one exemplary implementation the new command code is used with data management controllers (e.g., management command controllers that combine inputting the spare area data and submitting the page program command into a single operation, etc.).

Figure 7:
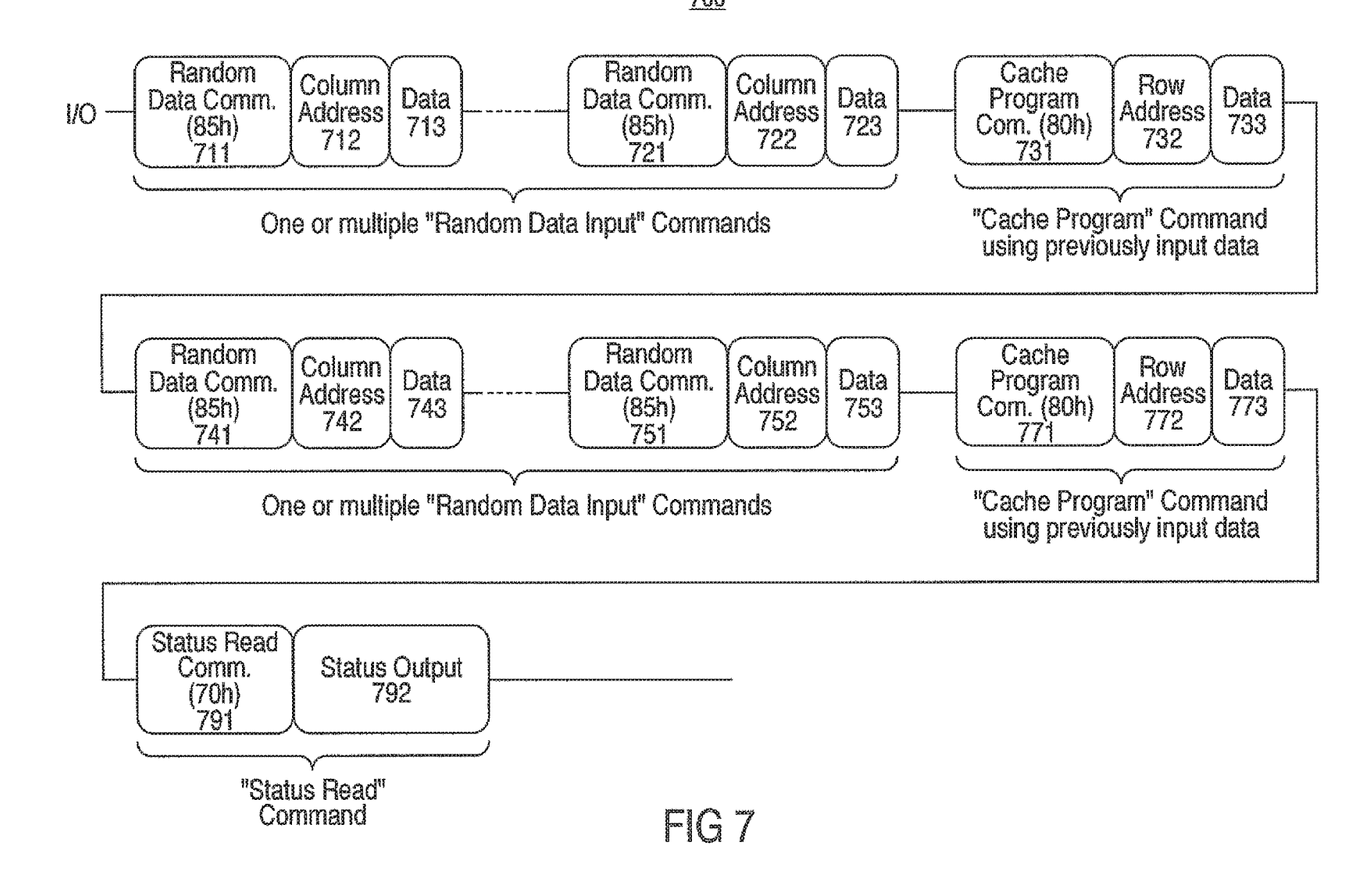
FIG. 7 is a block diagram of an exemplary random data input command cycle sequence with a cache program in accordance with one embodiment of the present invention.

FIG. 7 is a block diagram of random data input command cycle sequence 700 in accordance with one embodiment of the present invention. In one embodiment, one or more random data input command cycles are forwarded before a program cache command cycle. For example, a plurality of command cycles are executed including random data load command (85h) 711, column address 712, data 713, random data load command (85h) 721, column address 722, and data 723 before row addresses included with load cache command (80h) 731, row address or page address 732, data 733, and program confirm command 734 are forwarded to the memory device. There can also be a second group of random data input command cycles. For example, a second plurality of command cycles are executed including random data load command (85h) 741, column address 742, data 743, random data load command (85h) 751, column address 752, and data 753 before row addresses included with load cache command (80h) 771, row address or page address 772, data 773 and program confirm command 774 are forwarded to the memory device. In one exemplary implementation, the memory does not care about column address 732 and column address 772. In one embodiment a status read command 751 is issued and a status output 752 is forwarded.

In one embodiment, forwarding a portion of the address information after the data (e.g., in a different phase, in a different command cycle, etc) enables memory controller or data management controllers (e.g., secure digital (SD) or multi-media card (MMC) controllers) to eliminate expensive internal random access memory (RAM) data buffers which would otherwise be required for holding data in the memory controller while calculating the portion of the address information (e.g., row address, page address, etc.). It is appreciated the data can be received over a variety of interfaces (e.g., universal serial bus (USB) interface, secure digital (SD) interface, multi-media card (MMC) interface, etc.).

In one exemplary implementation, firmware inside the memory controllers calculates the row or page address to be used and also calculates control data and error correction code (ECC) information (e.g. ECC information to be stored in the page spare area, etc.). The firmware can also forward a program command with page+spare data to the memory device (e.g., flash device, etc.). In the present exemplary implementation, the data received from the host can be rapidly or immediately forwarded to a buffer of the memory (e.g., memory device's data buffer, etc.) while firmware calculates the page address to be used and the control data and ECC information. Spare area data is input into the memory device's data buffers when this calculation has finished and before the page program command is forwarded. In addition, the present exemplary implementation also allows for scaling of data buffer space when multiple [OR] NAND dies are used to implement interleaved programming. Without this extension, the controller typically has to be optimized for a particular number of memory dies and a particular size of page buffers within these dies.

In one embodiment, the page data can be selectively patched with new information and programmed into a new location. In one exemplary implementation, this is similar to a "Page Duplicate Program" operation. Data management controllers often have to read a page (e.g., 2K+spare, etc.), overwrite just 512-bytes, update spare data and program the new 2K+spare into a new location. In one embodiment, firmware can load the page into the data buffer using command 00h, then submit one or multiple random data input commands (85h) and program the new page contents using command 80h. In addition, repeating page contents (e.g., same page+spare contents to be programmed into multiple pages, etc.) can be more efficiently programmed because the data pattern is input once and can be programmed multiple times.

Thus, the present invention facilitates efficient and effective information storage. The present invention enables reduction of buffer resources in a memory controller. Elimination of the buffer in the memory controller can result in a reduced controller died size. In addition, the elimination of the buffer in the memory controller can also improve overall system performance because data transfer flows rapidly from the host to the memory device without being stored in the memory controller for determination of the complete address information.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A memory system comprising:
   a memory array;
   a buffer space; and
   a memory logic, operatively coupled with the memory array and the buffer space, to:
   receive data associated with a logical block address (LBA) from a host system to be stored in the memory array;
   translate the LBA to a physical block address (PBA) by determining a first portion of the PBA and a second portion of the PBA;
   store the data from the host system in the buffer space after determining the first portion of the PBA and before determining the second portion of the PBA; and
   flush the data from the buffer space to the memory array after determining the second portion of the PBA.

2. The memory system of claim 1, wherein the memory logic is further to calculate error correction code (ECC) information of the data, wherein the data is stored in the buffer space during the calculation of the ECC.

3. The memory system of claim 1, wherein the first portion of the PBA corresponds to a column address and the second portion of the PBA corresponds to a row address.

4. The memory system of claim 1, wherein determining the first portion of the PBA corresponds to a first amount of time and the determining of the second portion of the PBA corresponds to a second amount of time that is larger than the first amount of time.

5. The memory system of claim 1, wherein the memory system corresponds to a NAND device.

* * * * *